(12) United States Patent
Moritomo (10) Patent No.: US 11,196,244 B2
(45) Date of Patent: Dec. 7, 2021

(54) ELECTRONIC DEVICE AND CONTROL METHOD THEREOF

(71) Applicant: CANON KABUSHIKI KAISHA, Tokyo (JP)

(72) Inventor: Hiroshi Moritomo, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 193 days.

(21) Appl. No.: 16/234,076

(22) Filed: Dec. 27, 2018

(65) Prior Publication Data

US 2019/0207379 A1    Jul. 4, 2019

(30) Foreign Application Priority Data

Dec. 28, 2017   (JP) .............................. JP2017-254554

(51) Int. Cl.
| | |
|---|---|
| *H02H 3/00* | (2006.01) |
| *H02H 3/20* | (2006.01) |
| *H02H 1/00* | (2006.01) |
| *G06F 1/28* | (2006.01) |
| *H02H 3/44* | (2006.01) |

(Continued)

(52) U.S. Cl.
CPC ............... *H02H 3/20* (2013.01); *G06F 1/28* (2013.01); *G06F 1/30* (2013.01); *G06F 13/4295* (2013.01); *H02H 1/0007* (2013.01); *H02H 1/0061* (2013.01); *H02H 3/202* (2013.01); *H02H 3/445* (2013.01); *G01R 19/12* (2013.01); *G01R 31/40* (2013.01); *G06F 2213/0042* (2013.01); *G06F 2213/3812* (2013.01); *G06F 2213/3854* (2013.01); *H01R 24/60* (2013.01); *H01R 2107/00* (2013.01)

(58) Field of Classification Search
None
See application file for complete search history.

(56) References Cited

U.S. PATENT DOCUMENTS

| | | | |
|---|---|---|---|
| 6,584,031 B2 * | 6/2003 | Fujisawa | ................ G11C 5/147 365/189.09 |
| 9,158,325 B1 | 10/2015 | Lim | |

(Continued)

FOREIGN PATENT DOCUMENTS

| | | |
|---|---|---|
| EP | 2146416 A2 | 1/2010 |
| GB | 1437078 A | 5/1976 |

(Continued)

OTHER PUBLICATIONS

Universal Serial Bus Power Delivery Specification, USB Power Delivery Specification Revision 2.0, Version 1.3, Jan. 12, 2017, 11 Pages.

(Continued)

*Primary Examiner* — Stephen W Jackson
(74) *Attorney, Agent, or Firm* — Cowan, Liebowitz & Latman, P.C.

(57) ABSTRACT

An electronic device includes a monitoring unit that monitors a voltage of a first terminal that receives power supplied from a power supply apparatus, and a control unit that performs control so as to stop the power supply from the power supply apparatus if a voltage variation per unit time of the first terminal is not less than a first predetermined value or the voltage of the first terminal is not less than a second predetermined value.

19 Claims, 7 Drawing Sheets

(51) Int. Cl.
*G06F 13/42* (2006.01)
*G06F 1/30* (2006.01)
*G01R 31/40* (2020.01)
*G01R 19/12* (2006.01)
*H01R 24/60* (2011.01)
*H01R 107/00* (2006.01)

(56) References Cited

U.S. PATENT DOCUMENTS

| | | | |
|---|---|---|---|
| 2005/0198407 A1* | 9/2005 | Lee | G06F 1/266 710/15 |
| 2007/0120579 A1 | 5/2007 | Komatsu et al. | |
| 2015/0301552 A1 | 10/2015 | Lim | |
| 2017/0126029 A1 | 5/2017 | Moritomo | |
| 2017/0222435 A1 | 8/2017 | Endo | |
| 2017/0264204 A1 | 9/2017 | Motoki | |
| 2018/0004277 A1 | 1/2018 | Matsui et al. | |
| 2018/0004279 A1 | 1/2018 | Matsui et al. | |

FOREIGN PATENT DOCUMENTS

| | | |
|---|---|---|
| JP | 09-215176 A | 8/1997 |
| JP | 2007-173766 A | 7/2007 |
| JP | 2013-132184 A | 7/2013 |
| JP | 2017-085853 A | 5/2017 |
| JP | 2017-085854 A | 5/2017 |
| JP | 2017-138951 A | 8/2017 |
| JP | 2017-163779 A | 9/2017 |
| JP | 2017-201862 A | 11/2017 |
| JP | 2018-007450 A | 1/2018 |
| JP | 2018-007451 A | 1/2018 |

OTHER PUBLICATIONS

The above patent documents were cited in a European Search Report dated Jun. 4, 2019, that issued in the corresponding European Patent Application No. 18213284.5.

The above documents were cited in the Oct. 11, 2021 Japanese Office Action, which is enclosed without English Translation, that issued in Japanese Patent Application No. 2017-254554.

* cited by examiner

ELECTRONIC DEVICE AND CONTROL METHOD THEREOF

BACKGROUND

Field of the Invention

Aspects of the disclosure generally relate to an electronic device and a control method thereof.

Description of the Related Art

A power supply apparatus (such as a personal computer, an AC-USB adapter, or the like) that includes a USB (Universal Serial Bus) interface can supply power, via a USB cable, to an electronic device that includes a USB interface, Japanese Patent Laid-Open No. 9-215176 discloses a method of setting a switch connected between an external power source and a load to a disconnected state when the voltage of the external power source is an overvoltage.

A power supply apparatus conforming to USB Power Delivery (USB PD) standard can supply power of a maximum of 100 W (5 A, 20 V) to an electronic device through a USB interface. Hence, depending on the state or the arrangement of the power supply apparatus, an excessive voltage exceeding the maximum value of voltage that can be applied from the power supply apparatus to the electronic device may be applied to a VBUS terminal of the electronic device. If such an excessive voltage is applied to the VBUS terminal of the electronic device, it may cause internal circuitry connected to the VBUS terminal of the electronic device to break down.

SUMMARY

According to an aspect of the embodiments, an electronic device or a control method more improved than the electronic device or control method described above is provided.

According to an aspect of the embodiments, internal circuitry of the electronic device can be protected from an excessive voltage.

According to an aspect of the embodiments, there is provided an electronic device comprising: a monitoring unit that monitors a voltage of a first terminal that receives power supplied from a power supply apparatus; and a control unit that performs control so as to stop the power supply from the power supply apparatus if a voltage variation per unit time of the first terminal is not less than a first predetermined value or the voltage of the first terminal is not less than a second predetermined value.

According to an aspect of the embodiments, there is provided a method comprising: monitoring a voltage of a first terminal which receives power supplied from a power supply apparatus; and performing control so as to stop the power supply from the power supply apparatus if a voltage variation per unit time of the first terminal is not less than a first predetermined value or the voltage of the first terminal is not less than a second predetermined value.

According to an aspect of the embodiments, there is provided a computer-readable medium that stores a program causing a computer to execute monitoring of a voltage of a first terminal which receives power supplied from a power supply apparatus; and performing control so as to stop the power supply from the power supply apparatus if a voltage variation per unit time of the first terminal is not less than a first predetermined value or the voltage of the first terminal is not less than a second predetermined value.

Further aspects of the embodiments will become apparent from the following embodiments.

DESCRIPTION OF THE EMBODIMENTS

Exemplary embodiments, features, and aspects of the disclosure will be described below with reference to the drawings. However, aspects of the disclosure are not limited to the following embodiments.

First Embodiment

Figure 1:
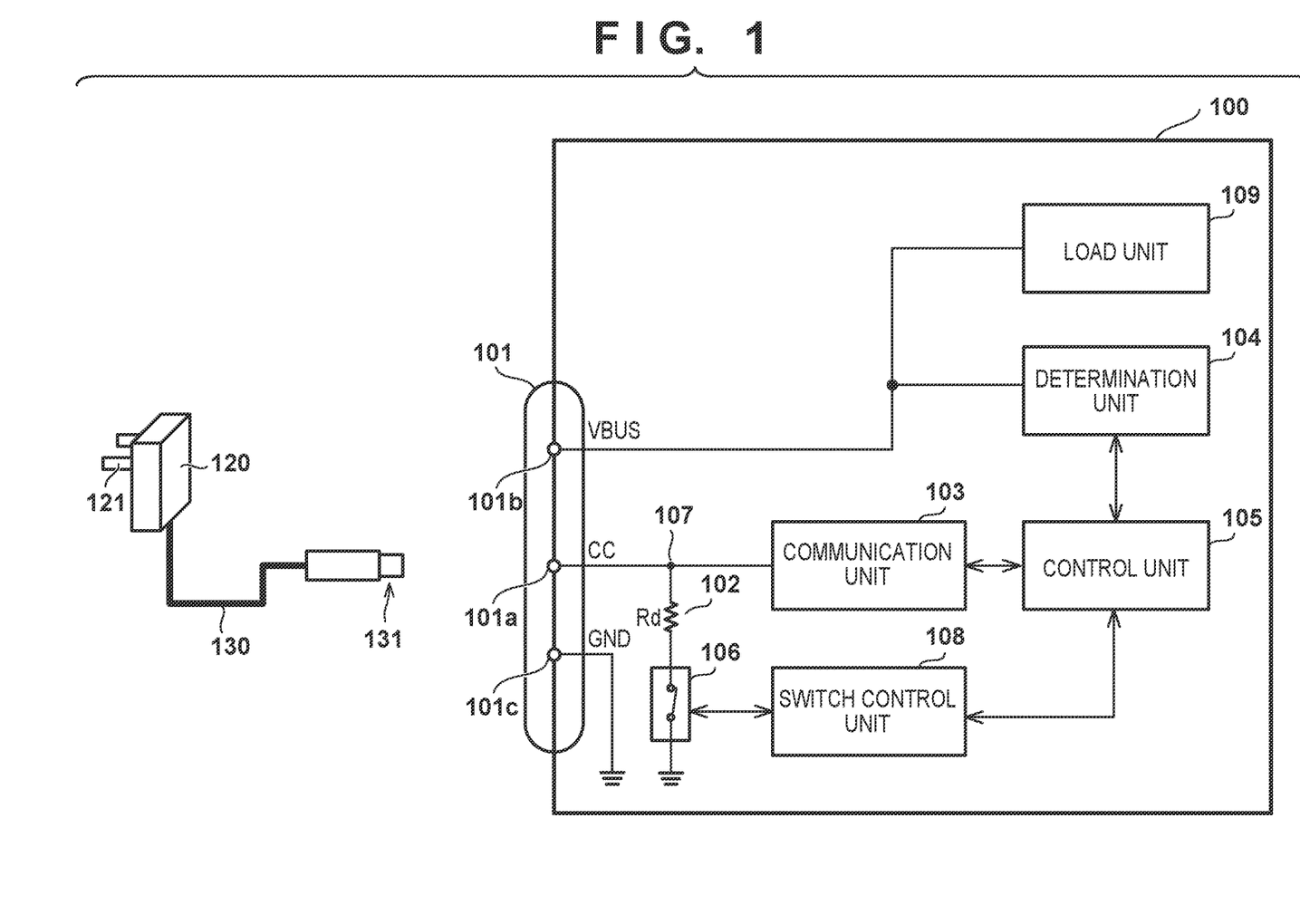
FIG. 1 is a block diagram for illustrating an example of components of an electronic device 100 according to the first embodiment.

An example of components of an electronic device 100 according to the first embodiment will be described first with reference to FIG. 1. FIG. 1 is a block diagram for illustrating components of the electronic device 100 according to the first embodiment. The electronic device 100 is an electronic device capable of acting as an image capture apparatus or a mobile device.

As shown in FIG. 1, the electronic device 100 includes a connector 101, a pull-down resistor 102, a communication unit 103, a determination unit 104, a control unit 105, a switch 106, a switch control unit 108, a load unit 109, and a battery (not shown). The battery can be removed from the electronic device 100 by the user.

The connector 101 is a USB Type-C connector (receptacle) to which a plug 131 of a USB Type-C cable 130 is connected. In this specification, a connector conforming to USB (Universal Serial Bus) Type-C standard will be referred to as a USB Type-C connector, and a cable conforming to the USB Type-C standard will be referred to as a USB Type-C cable. A power supply apparatus 120 is connected to the connector 101 via the USB Type-C cable 130. The connector 101 receives power supplied from the power supply apparatus 120 via the USB Type-C cable 130.

Figure 2:
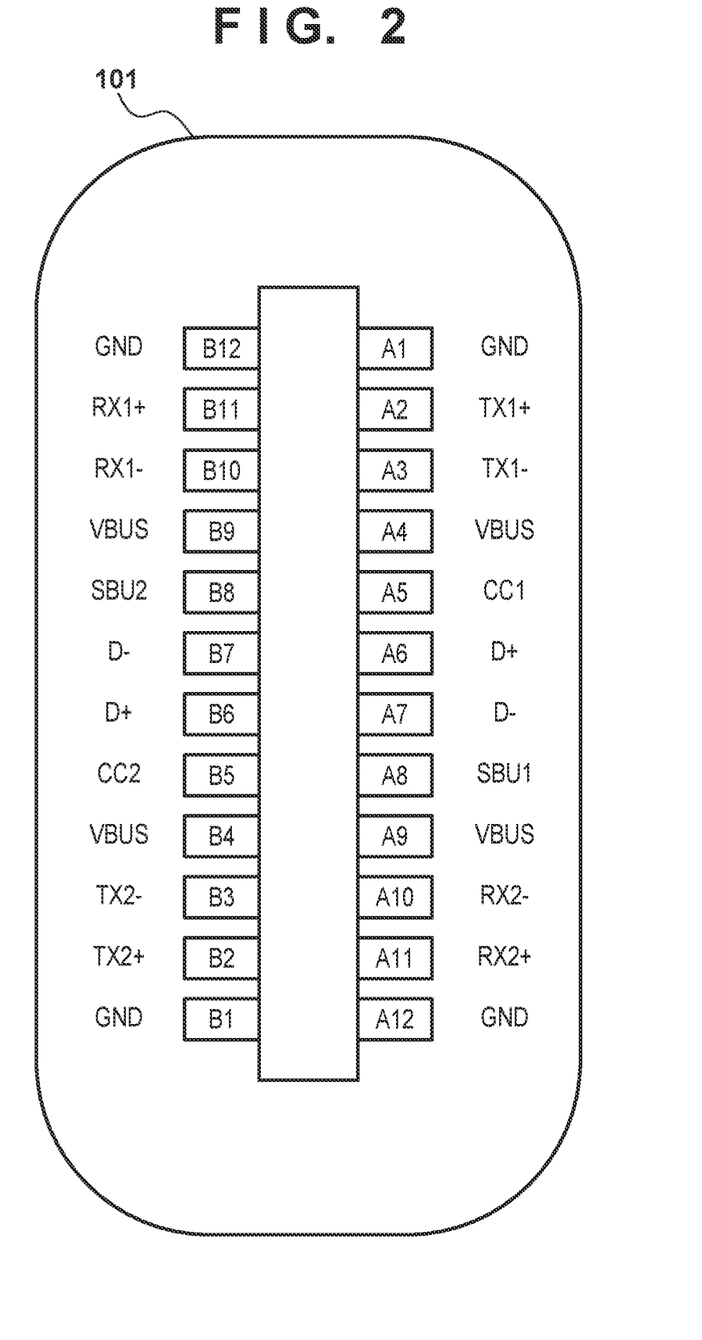
FIG. 2 is a view for illustrating a pin assignment of a connector 101.

The connector 101 includes at least a CC (Configuration Channel) terminal 101a, a VBUS terminal 101b, and a GND terminal 101c. The CC terminal 101a is used to perform predetermined communication (to be referred to as predetermined USB PD communication) conforming to USB PD (Power Delivery) standard with the power supply apparatus 120. The CC terminal 101a is used for determining the power supply capability of the power supply apparatus 120 by a method conforming to the USB Type-C standard. The VBUS terminal 101b is used to supply power from the power supply apparatus 120 to the electronic device 100. The GND terminal 101c is connected to a ground line. The connector 101 has a pin assignment as that shown in FIG. 2. FIG. 2 is a view for illustrating the pin assignment of the connector 101. The connector 101 has a point-symmetric pin assignment as shown in FIG. 2.

One end of the pull-down resistor 102 is connected to the ground line via the switch 106. The voltage of the ground line is, for example, 0 V. The other end of the pull-down resistor 102 is connected to the CC terminal 101a and communication unit 103 via a node 107. The resistance of the pull-down resistor 102 is defined by the USB Type-C standard. The pull-down resistor 102 is used to change the voltage of the CC terminal 101a.

The communication unit 103 is connected to the CC terminal 101a via the node 107. The communication unit 103 performs the predetermined USB PD communication with the power supply apparatus 120 via the CC terminal 101a and determines whether the communication unit 103 can perform the predetermined USB PD communication with the power supply apparatus 120. The control unit 105 is notified by the communication unit 103 as to whether the communication unit 103 is capable of performing the USB PD communication with the power supply apparatus 120.

Figure 5A:
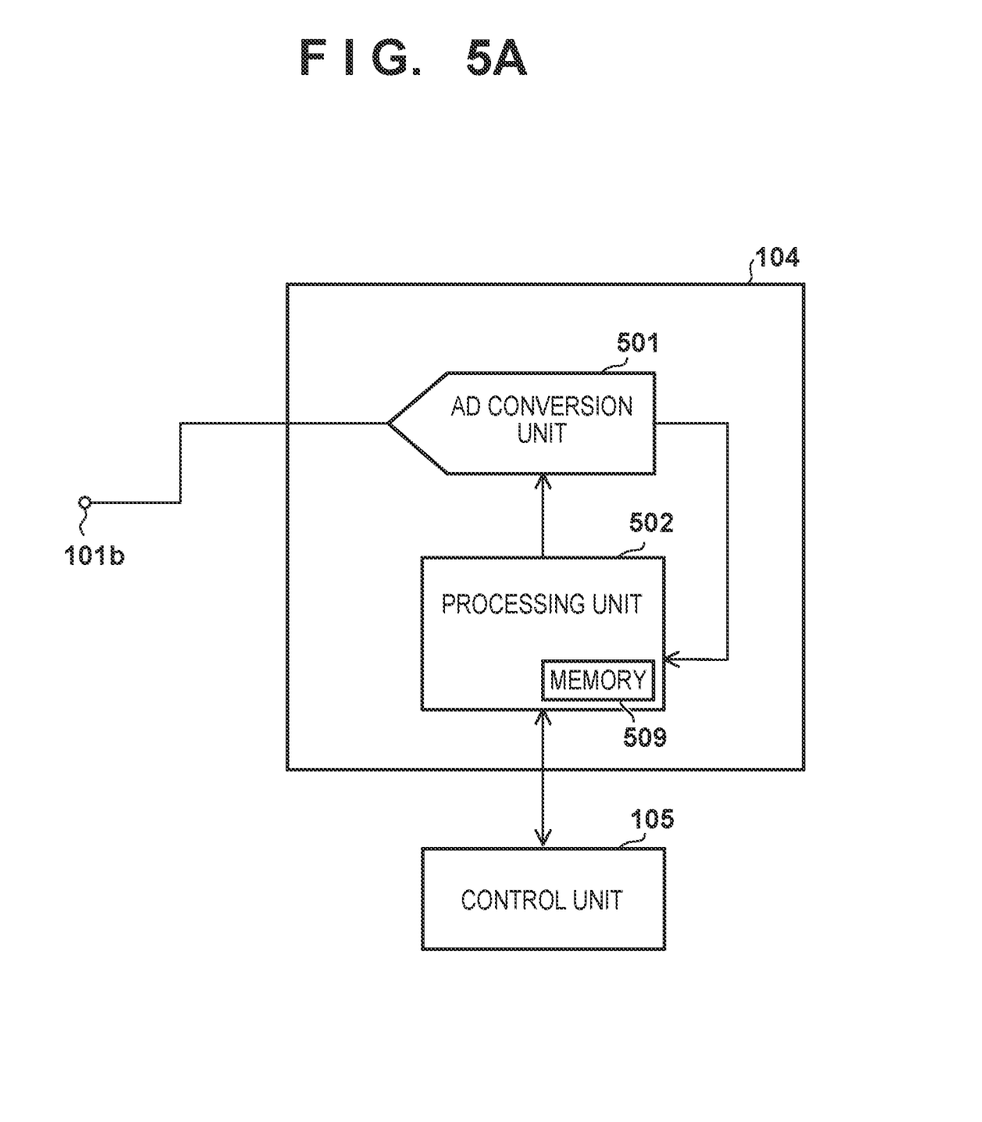
FIG. 5A is a block diagram for illustrating an example of components of the determination unit 104.
Figure 5B:
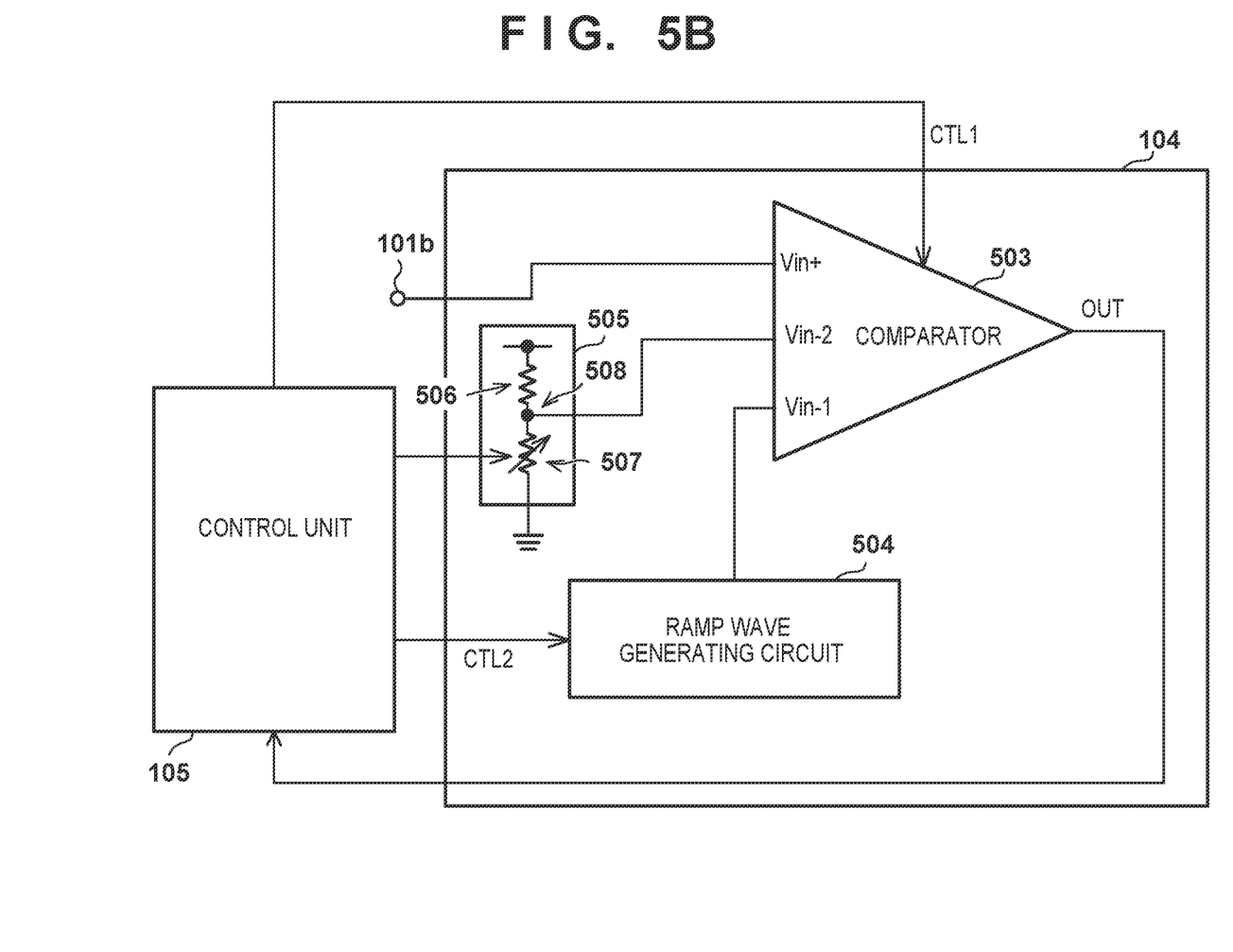
FIG. 5B is a block diagram for illustrating another example of components of the determination unit 104.

The determination unit 104 is connected to the VBUS terminal 101b. The determination unit 104 determines whether a first condition expressed as $$\Delta V < A [mV/\mu s] \quad (1)$$

is satisfied, and a second condition expressed as $$V < Vreq \times B [V] \quad (2)$$

is satisfied. If one of the first condition and the second condition is not satisfied, the determination unit 104 supplies, to the control unit 105, a signal indicating that the voltage applied from the power supply apparatus 120 to the VBUS terminal 101b is excessive. Note that arrangement examples of the determination unit 104 will be described later (see FIGS. 5A and 5B).

αV of inequality (1) is a voltage variation per unit time of the VBUS terminal 101b. A of inequality (1) is the maximum allowable value (corresponding to the maximum value of the voltage variation αV allowed by the VBUS terminal 101b) of the voltage variation ΔV per unit time. A of inequality (1) is determined based on, for example, a voltage Vreq of inequality (2). The first embodiment and the other embodiments will describe a case in which the voltage Vreq is, for example, 9 V and A is, for example, 30 mV/μs. Note that it is possible to determine A based on the USB PD standard.

V of inequality (2) is the voltage of the VBUS terminal 101b. The voltage Vreq (corresponding to a predetermined voltage) of inequality (2) is the voltage that the electronic device 100 requests the power supply apparatus 120 to apply to the VBUS terminal 101b. B of inequality (2) is determined based on the voltage Vreq. Vreq×B indicates the maximum allowable voltage (corresponding to the maximum value of voltage allowed to be applied to the VBUS terminal 101b) of the VBUS terminal 101b. The first embodiment and the other embodiments will describe a case in which the voltage Vreq is, for example, 9 V and B is, for example, 1.05. Note that it is possible to determine B based on the USB PD standard.

The control unit 105 includes a memory storing programs for controlling the components of the electronic device 100 and a processor (e.g., a hardware processor) that controls the components of the electronic device 100 by executing the corresponding programs stored in the memory.

The switch 106 is a switch for switching whether to connect the pull-down resistor 102 to the ground line. When the switch 106 is set to an ON state (corresponding to a conductive state), the pull-down resistor 102 is connected to the ground line, and the voltage of the CC terminal 101a is pulled down until it is at the level of the pull-down voltage. Note that the pull-down voltage suffices to be a voltage (for example, 2.45 V or lower) conforming to the USB Type-C standard. When the switch 106 is set to an OFF state (corresponding to a non-conductive state), the pull-down resistor 102 is cut off from the ground line, and the voltage of the CC terminal 101a changes to a voltage (for example, 5 V) higher than the pull-down voltage. Note that the first embodiment and the other embodiments will describe an example in which the switch 106 is arranged between the pull-down resistor 102 and the ground line, but the arrangement of the switch 106 is not limited to this. For example, the switch 106 may be arranged between the node 107 and the pull-down resistor 102.

The switch control unit 108 controls the switch 106 so that the switch 106 will be set to the ON state or the OFF state. The switch control unit 108 controls the switch 106 based on a control signal supplied from the control unit 105. If the determination unit 104 determines that one of the first condition expressed by inequality (1) and the second condition expressed by inequality (2) is not satisfied, the control unit 105 supplies the control signal to the switch control unit 108 to set the switch 106 in the OFF state. The switch control unit 108 sets the switch 106 in the OFF state based on the control signal supplied from the control unit 105. When the switch 106 is set to the OFF state, the voltage of the CC terminal 101a changes to a voltage (for example, 5 V) higher than the pull-down voltage. When the voltage of the CC terminal 101a changes to a voltage (for example, 5 V) higher than the pull-down voltage, the power supply apparatus 120 determines that the power supply apparatus 120 has been disconnected from the electronic device 100. If it is determined that the power supply apparatus 120 has been disconnected from the electronic device 100, the power supply apparatus 120 stops applying the voltage to the YBUS terminal 101b. Note that it may be set so that the control unit 105 will supply, after a predetermined time has elapsed since the control signal for setting the switch 106 to the OFF state has been supplied to the switch control unit 108, the control signal for setting the switch 106 to the ON state. The predetermined time suffices to be a time enough for the power supply apparatus 120 to determine that the power supply apparatus 120 has been disconnected from the electronic device 100 based on the voltage change in the CC terminal 101a.

The load unit 109 is connected to the VBUS terminal 101b. The load unit 109 includes components to provide a user with functions that serve as an image capture apparatus or a mobile device. The load unit 109 operates by power supplied from the power supply apparatus 120 or the battery. The power supplied from the power supply apparatus 120 is supplied to the load unit 109 via the VBUS terminal 101b.

The power supply apparatus 120 operates as an external power source apparatus that supplies power to the electronic device 100 via the USB Type-C cable 130. The power supply apparatus 120 operates, for example, as an AC-USB adapter. The power supply apparatus 120 includes at least a plug 121 which is connected to an AC power source (not shown), a conversion unit (not shown) that converts AC voltage into DC voltage, and a connector (not shows) to which the USB Type-C cable 130 is connected. Note that the power supply apparatus 120 is not limited to the AC-USB adapter. For example, the power supply apparatus 120 may be a personal computer or a portable battery.

Figure 3:
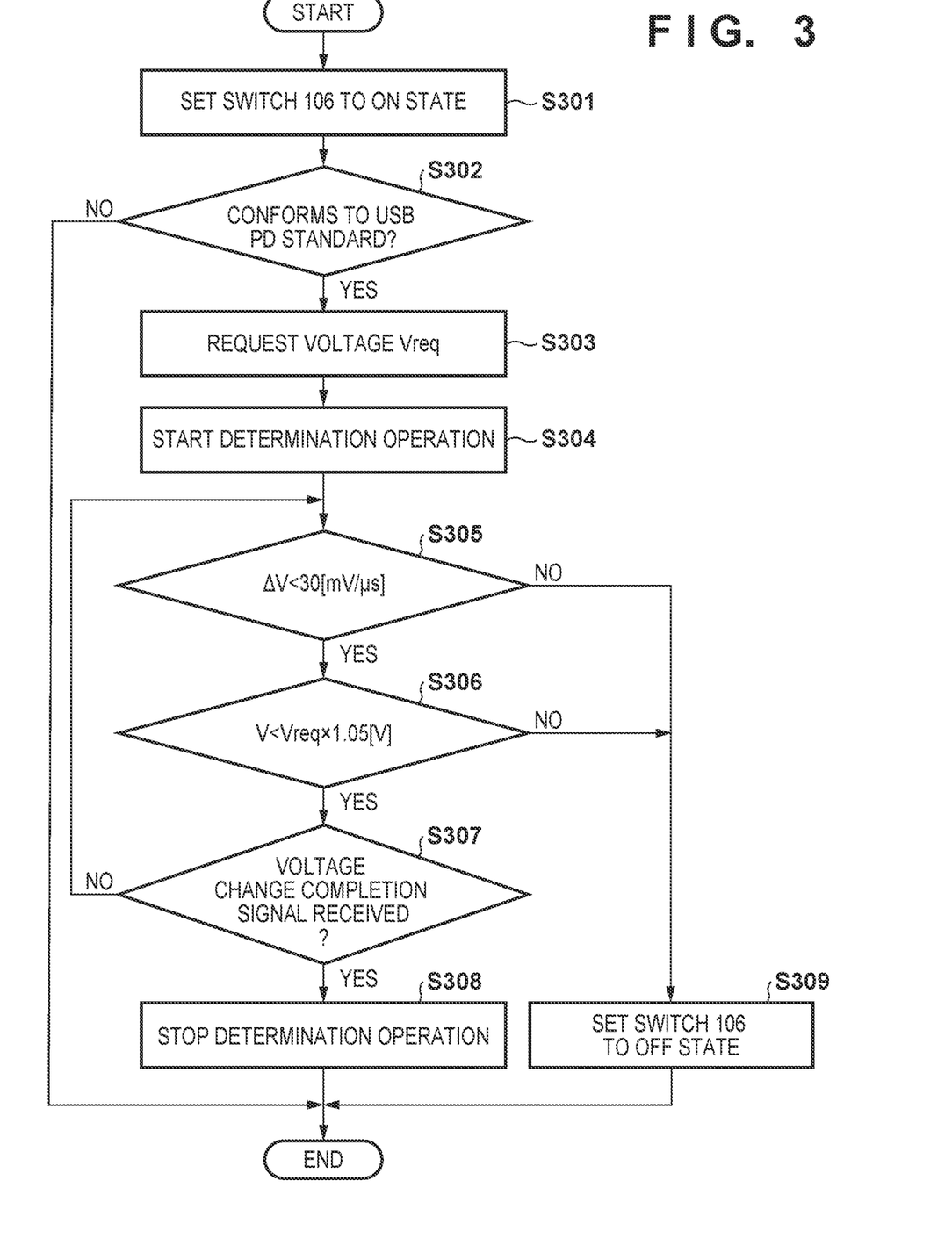
FIG. 3 is a flowchart for illustrating an example of an operation of the electronic device 100 according to the first embodiment.

FIG. 3 is a flowchart for illustrating an example of the operation of the electronic device 100 according to the first embodiment.

When the plug 131 of the USB Type-C cable 130 is inserted to the connector 101 of the electronic device 100, the process of step S301 is started. In step S301, the control unit 105 supplies, to the switch control unit 108, the control signal for setting the switch 106 to the ON state. The switch control unit 108 sets the switch 106 to the ON state based on the control signal supplied from the control unit 105. As a result, the pull-down resistor 102 is connected to the ground line, and the voltage of the CC terminal 101a is pulled down to the pull-down voltage.

In step S302, the control unit 105 determines whether the power supply apparatus 120 conforms to the USB PD standard based on whether the communication unit 103 can perform the predetermined USB PD communication with the power supply apparatus 120. If the communication unit 103 can perform the predetermined USB PD communication with the power supply apparatus 120 (YES in step S302), the control unit 105 determines that the power supply apparatus 120 conforms to the USB PD standard. If it is determined that the power supply apparatus 120 conforms to the USB PD standard, the control unit 105 proceeds to step S303. On the other hand, if the communication unit 103 cannot perform the predetermined USB PD communication with the power supply apparatus 120 (NO in step S302), the control unit 105 determines that the power supply apparatus 120 does not conform to the USB PD standard. If it is determined that the power supply apparatus 120 does not conform to the USB PD standard, the switch 106 is maintained in the ON state. In this case, power conforming not to the USB PD standard, but to the USB Type-C standard will be supplied from the power supply apparatus 120 to the electronic device 100.

In step S303, the communication unit 103 requests the power supply apparatus 120 via the CC terminal 101a to increase the voltage applied by the power supply apparatus 120 to the VBUS terminal 101b to the voltage Vreq. The first embodiment and the other embodiments will describe an example in which the voltage Vreq is, for example, 9 V.

In step S304, the control unit 105 requests the determination unit 104 to execute a determination operation. The determination unit 104 starts the determination operation. As a result, the monitoring of the voltage of the VBUS terminal 101b is started by the determination unit 104.

In step S305, the determination unit 104 detects the voltage of the VBUS terminal 101b and determines whether it satisfies the first condition expressed by inequality (1). For example, the determination unit 104 determines, based on the difference between the voltage of the VBUS terminal 101b previously detected by the determination unit 104 and the voltage of the VBUS terminal 101b most recently detected by the determination unit 104, whether the voltage variation $\Delta V$ per unit time of the VBUS terminal 101b is less than 30 mV/µs (less than a first predetermined value). If the voltage variation $\Delta V$ per unit time of the VBUS terminal 101b is less than 30 mV/µs (YES in step S305), the determination unit 104 determines that the first condition is satisfied. In a case in which it is determined that the first condition is satisfied, the control unit 105 proceeds to step S306. On the other hand, if the voltage variation $\Delta V$ per unit time of the VBUS terminal 101b is equal to or more than 30 mV/µs (equal to or more than the first predetermined value) (NO in step S305), the determination unit 104 determines that the first condition is not satisfied. In a case in which it is determined that the first condition is not satisfied, the determination unit 104 supplies, to the control unit 105, a signal indicating that the voltage applied from the power supply apparatus 120 to the VBUS terminal 101b is excessive, and the control unit 105 proceeds to step S309.

In step S309, the control unit 105 determines that the voltage applied from the power supply apparatus 120 to the VBUS terminal 101b is excessive. In addition, the control unit 105 controls the determination unit 104 to stop the determination operation, and supplies, to the switch control unit 108, the control signal for setting the switch 106 to the OFF state. The switch control unit 108 sets the switch 106 to the OFF state based on the control signal supplied from the control unit 105. The pull-down resistor 102 is cut off from the ground line when the switch 106 is set to the OFF state, and the voltage of the CC terminal 101a changes to a voltage (for example, 5 V) higher than the pull-down voltage. If the voltage of the CC terminal 101a changes to a voltage (for example, 5 V) higher than the pull-down voltage, the power supply apparatus 120 determines that the power supply apparatus 120 has been disconnected from the electronic device 100. If it is determined that the power supply apparatus 120 has been disconnected from the electronic device 100, the power supply apparatus 120 stops applying the voltage to the VBUS terminal 101b. As a result, the electronic device 100 can protect the internal circuitry (the load unit 109 or the like) connected to the VBUS terminal 101b of the electronic device 100 from an excessive voltage.

In step S306, the determination unit 104 detects the voltage of the VBUS terminal 101b and determines whether it satisfies the second condition expressed by inequality (2). For example, the determination unit 104 determines whether the voltage of the VBUS terminal 1016 is lower than 9.45 V (corresponding to a second predetermined value). If the voltage of the VBUS terminal 101b is lower than 9.45 V (YES in step S306), the determination unit 104 determines that the second condition is satisfied. If it is determined that the second condition is satisfied, the control unit 105 proceeds to step S307. On the other hand, if the maximum allowable voltage of the VBUS terminal 101b is equal to or higher than 9.45 V (NO in step S306), the determination unit 104 determines that the second condition is not satisfied. If it is determined that the second condition is not satisfied, the determination unit 104 supplies, to the control unit 105, a signal indicating that the voltage applied from the power supply apparatus 120 to the VBUS terminal 101b is excessive, and the control unit 105 proceeds to step S309. Note that the determination unit 104 will also determine that the second condition is not satisfied in a case in which the repetition of the processes of steps S305, S306, and S307 has exceeded a predetermined count.

In step S307, the communication unit 103 determines whether it has been able to receive a voltage change completion signal from the power supply apparatus 120 via the CC terminal 101a. The voltage change completion signal contains information indication the completion of the operation to increase the voltage applied to the VBUS terminal 101b to the voltage Vreq. The control unit 105 is notified by the communication unit 103 as to whether the communication unit 103 has been able to receive the voltage change completion signal from the power supply apparatus 120 via the CC terminal 101a. If the communication unit 103 has been able to receive the voltage change completion signal from the power supply apparatus 120 via the CC terminal 101a (YES in step S307), the control unit 105 determines that the operation to increase the voltage applied to the VBUS terminal 101b to the voltage Vreq has been completed, and proceeds to step S308. If the communication unit 103 has not been able to receive the voltage change completion signal from the power supply apparatus 120 via the CC terminal 101a (NO in step S307), the control unit 105 returns to step S305.

In step S308, the control unit 105 requests the determination unit 104 to stop the determination operation. The determination unit 104 accordingly stops the determination operation. Even when the determination unit 104 has stopped the determination operation, the switch 106 is maintained in the ON state. By maintaining the switch 106 in the ON state, the power supply from the power supply apparatus 120 to the electronic device 100 is maintained even after step S308.

Figure 4A:
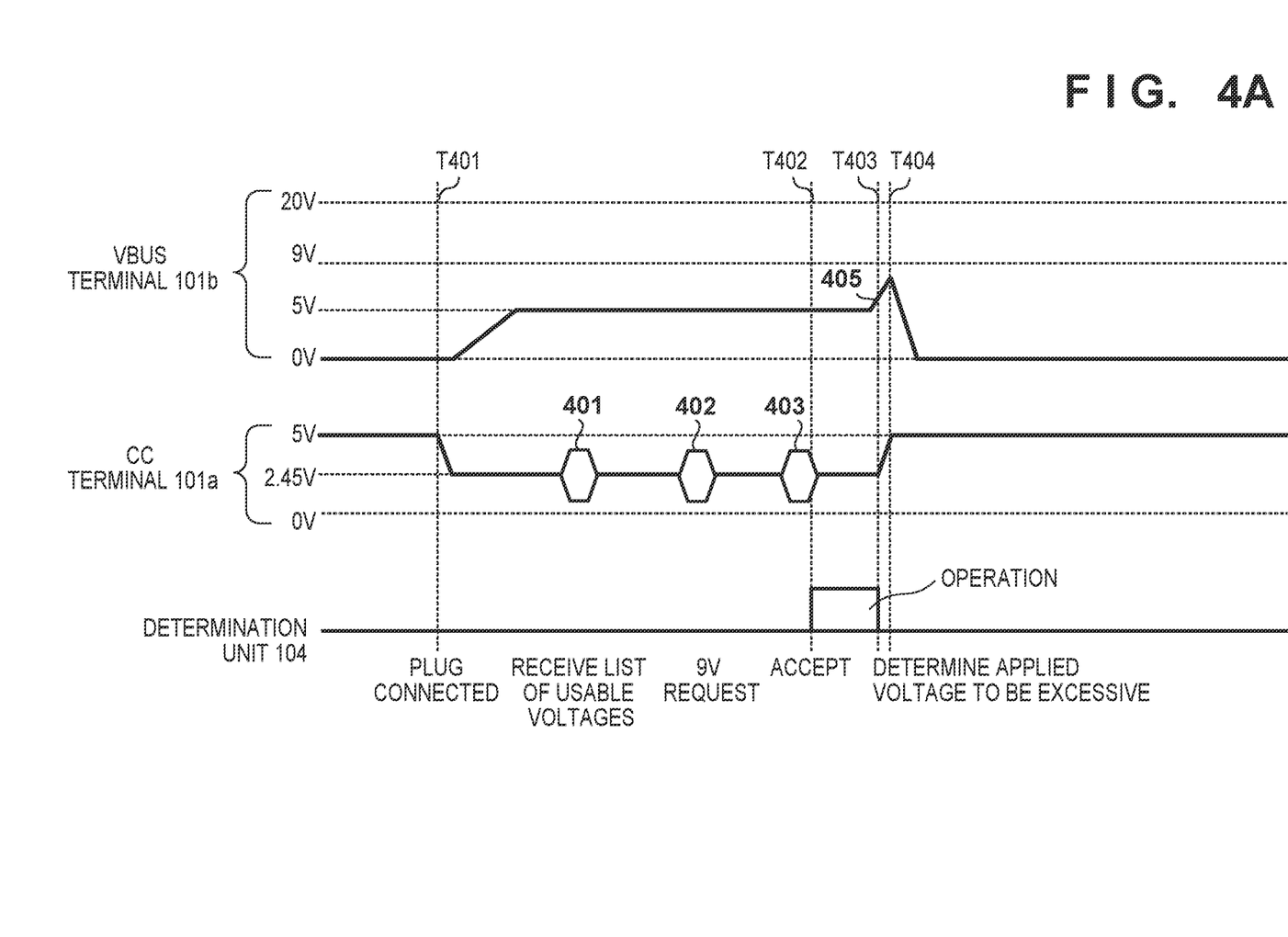
FIG. 4A is a timing chart for illustrating an example of changes in the states of a CC terminal 101a, a VBUS terminal 101b, and a determination unit 104.
Figure 4B:
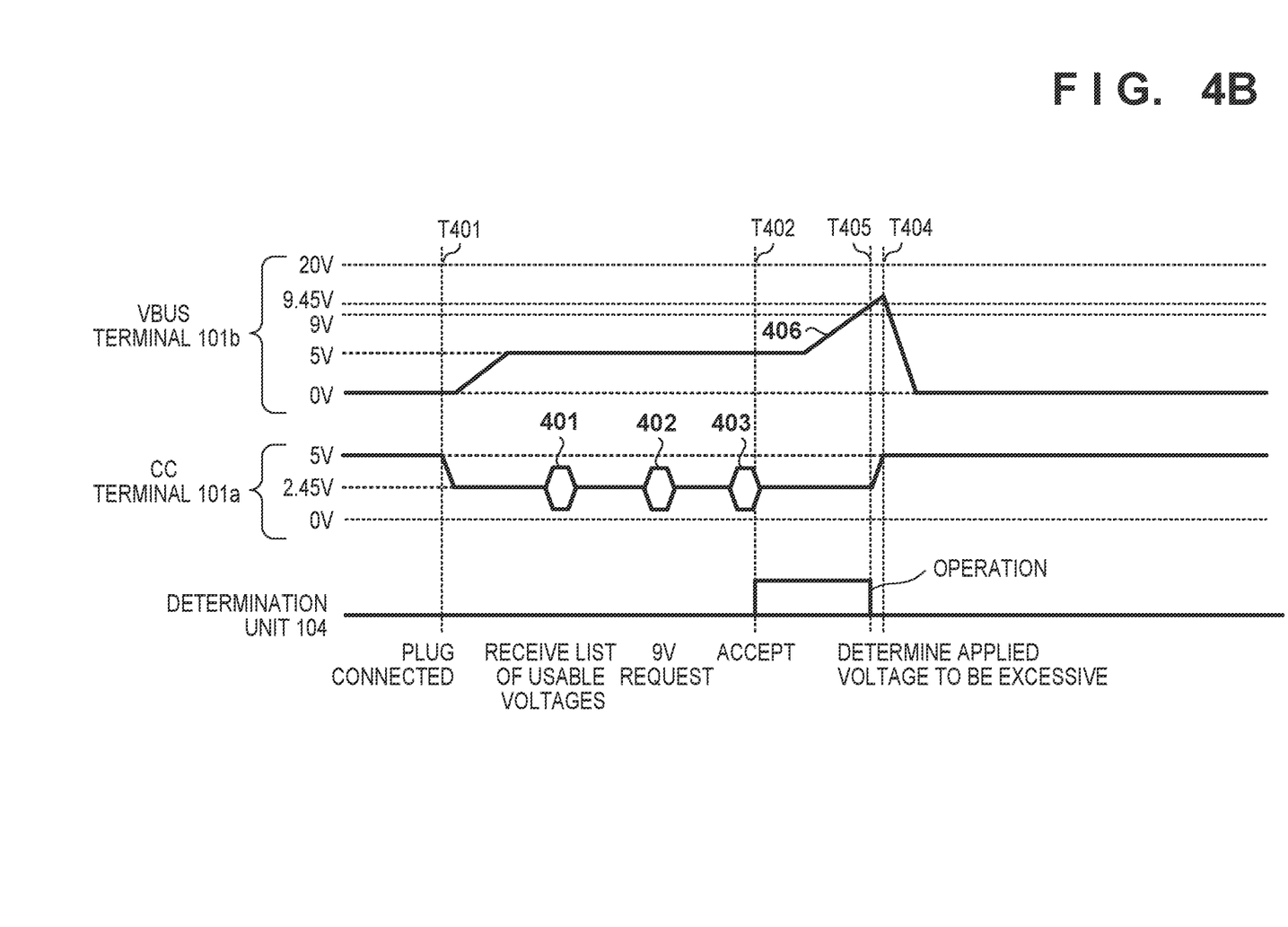
FIG. 4B is a timing chart for illustrating an example of changes in the states of the CC terminal 101a, the VBUS terminal 101b, and the determination unit 104.

FIGS. 4A and 4B are timing charts for illustrating examples of the changes in the states of the CC terminal 101a, the VBUS terminal 101b, and the determination unit 104. First, an example of the changes in the states of the CC terminal 101a, the VBUS terminal 101b, and the determination unit 104 in a case in which the first condition expressed by inequality (1) is not satisfied will be described with reference to FIG. 4A.

T401 indicates the point at which the plug 131 of the USB Type-C cable 130 has been inserted to the connector 101 of the electronic device 100 in a state in which the power supply apparatus 120 and the USB Type-C cable 130 are connected. At T401, the voltage of the CC terminal 101a is a voltage (for example, 5 V) higher than the pull-down voltage. Since the power supply apparatus 120 will determine that the power supply apparatus 120 is not connected to the electronic device 100 when the voltage of the CC terminal 101a is a voltage (for example, 5 V) higher than the pull-down voltage, the power supply apparatus 120 will not apply the voltage to the VBUS terminal 101b. Hence, at T401, the voltage of the VBUS terminal 101b is, for example, 0 V.

When the plug 131 of the USB Type-C cable 130 is inserted to the connector 101 of the electronic device 100. The process of step S301 is started. In step S301, the control unit 105 supplies, to the switch control unit 108, the control signal to set the switch 106 to the ON state. The switch control unit 108 sets the switch 106 to the ON state based on the control signal supplied from the control unit 105. As a result, the pull-down resistor 102 is connected to the ground line, and the voltage of the CC terminal 101a is pulled down to the pull-down voltage (for example, 2.45 V). When the voltage of the CC terminal 101a has changed to the pull-down voltage, the power supply apparatus 120 determines that the power supply apparatus 120 has been connected to the electronic device 100, and applies, to the VBUS terminal 101b, a voltage (for example, 5 V) higher than the pull-down voltage.

When a voltage (for example, 5 V) higher than the pull-down voltage is applied to the VBUS terminal 101b, the communication unit 103 performs USB PD communications 401, 402, and 403 with the power supply apparatus 120 via the CC terminal 101a. The USB PD communications 401, 402, and 403 each are communications conforming to the USB PD standard.

In the USB PD communication 401, the power supply apparatus 120 transmits a list of usable voltages to the electronic device 100. The communication unit 103 receives the list of usable voltages from the power supply apparatus 120 via the CC terminal 101a and notifies the control unit 105 of the received list. If the control unit 105 is notified of the list of usable voltages from the communication unit 103 before the elapse of a predetermined time from the start of the USB PD communication 401, the control unit 105 will determine that the communication unit 103 has been able to perform the USB PD communication with the power supply apparatus 120. In this case, the control unit 105 will determine that the power supply apparatus 120 conforms to the USB PD standard (YES in step S302). On the other hand, if the control unit 105 is not notified of the list of usable voltages from the communication unit 103 before the elapse of a predetermined time from the start of the USB PD communication 401, the control unit 105 will determine that the communication unit 103 has not been able to perform the USB PD communication with the power supply apparatus 120. In this case, the control unit 105 will determine that the power supply apparatus 120 does not conform to the USB PD standard (NO in step S302).

After it is determined that the power supply apparatus 120 conforms to the USB PD standard, the communication unit 103 performs the USB PD communication 402 with the power supply apparatus 120. In the USB PD communication 402, the communication unit 103 requests the power supply apparatus 120 via the CC terminal 101a to increase the voltage applied by the power supply apparatus 120 to the VBUS terminal 101b to the voltage Vreq (for example, 9 V) (step S303).

After requesting the power supply apparatus 120 via the CC terminal 101a to increase the voltage applied by the power supply apparatus 120 to the VBUS terminal 101b to the voltage Vreq (for example, 9 V), the communication unit 103 performs the USB PD communication 403 with the power supply apparatus 120. In the USB PD communication 403, the power supply apparatus 120 transmits, to the electronic device 100, an acceptance signal that includes information indicating that it has accepted the request to increase the voltage applied to the VBUS terminal 101b to the voltage Vreq. The communication unit 103 determines whether it has been able to receive the acceptance signal from the power supply apparatus 120 via the CC terminal 101a. The control unit 105 is notified by the communication unit 103 as to whether the communication unit 103 has been able to receive the acceptance signal from the power supply apparatus 120 via the CC terminal 101a.

After the communication unit 103 has received the acceptance signal from the power supply apparatus 120 via the CC terminal 101a, the control unit 105 requests the determination unit 104 to start the determination operation described above (step S304). T402 indicates the point at which the determination operation is started by the determination unit 104.

When the power supply apparatus 120 applies the voltage Vreq (for example, 9 V) to the VBUS terminal 101b, the voltage of the VBUS terminal 101b gradually increases as shown by reference numeral 405. In a period from T402 until the above-described voltage change completion signal is received, the determination unit 104 repetitively determines whether both the first condition expressed by inequality (1) and the second condition expressed by inequality (2) are satisfied.

T403 indicates the point at which the voltage variation ΔV per unit time of the VBUS terminal 101b is, for example, equal to or more than 30 mV/μs. At T403, the determination unit 104 determines that the first condition expressed by inequality (1) is not satisfied (NO in step S305). When it is determined that the first condition expressed by inequality (1) is not satisfied, the determination unit 104 supplies, to the control unit 105, a signal indicating that the voltage applied from the power supply apparatus 120 to the VBUS terminal 101b is excessive. Then, in step S309, the control unit 105 controls the determination unit 104 to stop the determination operation and supplies a control signal, to the switch control unit 108, to set the switch 106 to the OFF state. In addition, in step S309, the switch control unit 108 sets the switch 106 to the OFF state based on the control signal supplied from the control unit 105. After the switch 106 is set to the OFF state, the pull-down resistor 102 is cut off from the ground line, and the voltage of the CC terminal 101a increases to a voltage (for example, 5 V) higher than the pull-down voltage.

T404 indicates the point at which the voltage of the CC terminal 101a has increased to a voltage (for example, 5 V) higher than the pull-down voltage. At T404, the power supply apparatus 120 detects that the voltage of the CC terminal 101a has become a voltage (for example, 5 V) higher than the pull-down voltage and determines that the power supply apparatus 120 has been disconnected from the electronic device 100. When it is determined that the power supply apparatus 120 has been disconnected from the electronic device 100, the power supply apparatus 120 stops applying the voltage to the VBUS terminal 101b. When applying the voltage from the power supply apparatus 120 to the VBUS terminal 101b is stopped, the voltage of the VBUS terminal 101b changes to 0 V As a result, the electronic device 100 can protect the internal circuitry (the load unit 109 or the like) connected to the VBUS terminal 101b of the electronic device 100 from an excessive voltage.

Next, an example of the changes in the states of the CC terminal 101a, the VBUS terminal 101b, and the determination unit 104 in a case in which the second condition expressed by inequality (2) is not satisfied will be described with reference to FIG. 4B. The processes from T401 to T402 of FIG. 4B are same as those from T401 to 1402 of FIG. 4A, and thus a description will be omitted.

When the power supply apparatus 120 applies the voltage Vreq (for example, 9 V) to the VBUS terminal 101b, the voltage of the VBUS terminal 101b gradually increases as shown by a reference numeral 406. In a period from T402 until the above-described voltage change completion signal is received, the determination unit 104 repetitively determines whether both the first condition expressed by inequality (1) and the second condition expressed by inequality (2) are satisfied.

T405 indicates the point at which the voltage of the VBUS terminal 101b has reached, for example. Vreq×B=9.45 V. At T405, the determination unit 104 determines that the second condition expressed by inequality (2) is not satisfied (NO in step S306). When it is determined that the second condition is not satisfied, the determination unit 104 supplies, to the control unit 105, a signal indicating that the voltage applied from the power supply apparatus 120 to the VBUS terminal 101b is excessive. Then, in step S309, the control unit 105 controls the determination unit 104 to stop the determination operation and supplies a control signal, to the switch control unit 108, to set the switch 106 to the OFF state. In addition, in step S309, the switch control unit 108 sets the switch 106 to the OFF state based on the control signal supplied from the control unit 105. After the switch 106 is set to the OFF state, the pull-down resistor 102 is cut off from the ground line, and the voltage of the CC terminal 101a increases to a voltage (for example, 5 V) higher than the pull-down voltage.

T404 indicates the point at which the voltage of the CC terminal 101a has changed to a voltage (for example, 5 V) higher than the pull-down voltage. At T404, the power supply apparatus 120 detects that the voltage of the CC terminal 101a has changed to a voltage (for example, 5 V) higher than the pull-down voltage, and determines that the power supply apparatus 120 has been disconnected from the electronic device 100. When it is determined that the power supply apparatus 120 has been disconnected from the electronic device 100, the power supply apparatus 120 stops applying the voltage to the VBUS terminal 101b. When applying the voltage from the power supply apparatus 120 to the VBUS terminal 101b is stopped, the voltage of the VBUS terminal 101b changes to 0 V. As a result, the electronic device 100 can protect the internal circuitry (the load unit 109 or the like) connected to the VBUS terminal 101b of the electronic device 100 from an excessive voltage.

FIG. 5A is a block diagram for illustrating an example of components of the determination unit 104. As shown in FIG. 5A, the determination unit 104 includes an AD conversion unit 501 and a processing unit 502. The operation of the processing unit 502 is controlled by the control unit 105, and the operation of the AD conversion unit 501 is controlled by the processing unit 502.

The AD conversion unit 501 is connected to the VBUS terminal 101b. The AD conversion unit 501 converts the voltage of the VBUS terminal 101b into a digital signal. The generated digital signal is supplied from the AD conversion unit 501 to the processing unit 502. A known AD conversion unit may be used as the AD conversion unit 501. The AD conversion unit 501 may be, for example, a successive approximation AD conversion unit or a sigma-delta AD conversion unit. Note that the voltage of the VBUS terminal 101b may be divided by a voltage dividing resistor before it is applied to the AD conversion unit 501.

The processing unit 502 determines, based on the digital signal supplied from the AD conversion unit 501, whether both the first condition expressed by inequality (1) and the second condition expressed by inequality (2) are satisfied. The processing unit 502 supplies a timing signal to the AD conversion unit 501 at an arbitrary timing (e.g., periodic timing). The AD conversion unit 501 generates a digital signal indicating the voltage of the VBUS terminal 101b in accordance with the timing signal supplied from the processing unit 502, and supplies the generated signal to the processing unit 502. As a result, a digital signal is periodically supplied from the AD conversion unit 501 to the processing unit 502. The processing unit 502 includes a memory 509. The memory 509 stores a digital signal indicating the voltage of the VBUS terminal 101b most recently supplied from the AD conversion unit 501 and a digital signal indicating the voltage of the VBUS terminal 101b previously supplied from the AD conversion unit 501. The processing unit 502 determines whether the first condition expressed by inequality (1) is satisfied based on a difference between the two digital signals stored in the memory 509 and A=30 mV/μs. In addition, the processing unit 502 determines whether the second condition expressed by inequality (2) is satisfied based on the most recent voltage V of the VBUS terminal 101b stored in the memory 509, Vreq=9, and B=1.05.

In the above-described step S305, the processing unit 502 calculates the voltage variation ΔV per unit time of the VBUS terminal 101b based on the difference between two digital signals stored in the memory 509. The voltage variation ΔV per unit time of the VBUS terminal 101b is calculated based on $$\Delta V=(V_x-V_{x+1})/t[\text{mV}/\mu s] \quad (3)$$

where $V_x$ is the previous voltage of the VBUS terminal 101b stored in the memory 509, $V_{x+1}$ is the most recent voltage of the VBUS terminal 101b stored in the memory 509, and t corresponds to a time interval from the point at which the previous voltage of the VBUS terminal 101b has been detected to the point at which the most recent voltage of the VBUS terminal 101b has been detected (alternatively, the time interval at which a digital signal is supplied from the AD conversion unit 501 to the processing unit 502).

After the voltage variation ΔV per unit time of the VBUS terminal 101b has been calculated, the processing unit 502 determines, based on the calculated voltage variation ΔV whether the first condition expressed by inequality (1) is satisfied. For example, the processing unit 502 compares the calculated voltage variation ΔV with 30 mV/μs. If the calculated voltage variation ΔV is lower than 30 mV/μs (YES in step S305), the determination unit 104 determines that the first condition is satisfied, if the first condition is satisfied, the control unit 105 proceeds to step S306. If the calculated voltage variation ΔV equal to or higher than 30 mV/μs (NO in step S305), the determination unit 104 determines that the first condition is not satisfied. If the first condition is not satisfied, the determination unit 104 supplies, to the control unit 105, a signal indicating that the voltage applied from the power supply apparatus 120 to the VBUS terminal 101b is excessive, and the control unit 105 proceeds to step S309.

In the above-described step S306, the processing unit 502 determines whether the second condition expressed by inequality (2) is satisfied based on the digital signal indicating the most recent voltage of the VBUS terminal 101b detected by the AD conversion unit 501. For example, the processing unit 502 compares the most recent voltage detected by the AD conversion unit 501 with Vreq×B=9.45 V. If the most recent voltage detected by the AD conversion unit 501 is lower than 9.45 V (YES in step S306), the determination unit 104 will determine that the second condition is satisfied. When the second condition is satisfied, the control unit 105 proceeds to step S307. If the most recent voltage detected by the AD conversion unit 501 is equal to higher than 9.45 V (NO in step S306), the determination unit 104 will determine that the second condition is not satisfied. When the second condition is not satisfied, the determination unit 104 supplies, to the control unit 105, the signal indicating that the voltage applied from the power supply apparatus 120 to the VBUS terminal 101b is excessive, and the control unit 105 proceeds to step S309.

In this manner, in a case in which the determination unit 104 determines that one of the first condition and the second condition described above is not satisfied, the signal indicating that the voltage of the VBUS terminal 101b is excessive is supplied from the processing unit 502 to the control unit 105. In this case, the control unit 105 supplies, to the switch control unit 108, the control signal for setting the switch 106 to the OFF state. The switch control unit 108 sets the switch 106 to the OFF state based on the control signal supplied from the control unit 105 (step S309).

FIG. 5B is a block diagram for illustrating another example of components of the determination unit 104. As shown in FIG. 5B, the determination unit 104 includes a comparator 503, a ramp wave generating circuit 504, and a reference voltage generating circuit 505. The operations of the comparator 503, the ramp wave generating circuit 504, and the reference voltage generating circuit 505 are controlled by the control unit 105.

The comparator 503 is a three-input comparator that includes a first input terminal Vin+, a second input terminal Vin-1, and a third input terminal Vin-2. The first input terminal Vin+ of the comparator 503 is connected to the VBUS terminal 101b, and the voltage of the VBUS terminal 101b is applied to the first input terminal Vin+. The second input terminal Vin-1 of the comparator 503 is connected to the ramp wave generating circuit 504, and the ramp wave generated by the ramp wave generating circuit 504 is input to the second input terminal Vin-1. The third input terminal Vin-2 of the comparator 503 is connected to the reference voltage generating circuit 505, and a reference voltage generated by the reference voltage generating circuit 505 is applied to the third input terminal Vin-2. In a case in which the voltage of the VBUS terminal 101b is lower than the voltage of the ramp wave supplied from the ramp wave generating circuit 504 and is lower than the reference voltage supplied from the reference voltage generating circuit 505, the comparator 503 outputs a signal OUT at low level. In a case in which the voltage of the VBUS terminal 101b is equal to or higher than the voltage of the ramp wave supplied from the ramp wave generating circuit 504 or is equal to or higher than the reference voltage supplied from the reference voltage generating circuit 505, the comparator 503 outputs the signal OUT at high level. The signal OUT output from the comparator 503 is input to the control unit 105. The signal OUT output from the comparator 503 at high level means that one of the first condition expressed by inequality (1) and the second condition expressed by inequality (2) is not satisfied. When the signal OUT output from the comparator 503 is changed from low level to high level, the control unit 105 supplies, to the switch control unit 108, the control signal to set the switch 106 to the OFF state. When a first control signal CTL1 supplied from the control unit 105 to the comparator 503 is at high level, the comparator 503 performs a comparison operation. When the first control signal CTL1 supplied from the control unit 105 to the comparator 503 is at low level, the comparator 503 does not perform the comparison operation.

The ramp wave generating circuit 504 generates a ramp wave (corresponding to the reference signal) which is a ramp-shaped analog signal. The ramp wave output from the ramp wave generating circuit 504 is input to the second input terminal Vin-1 of the comparator 503. In a case in which the voltage Vreq is, for example, 9 V, the ramp wave generating circuit 504 outputs a ramp wave corresponding to 30 mV/μs. When a second control signal CTL2 supplied from the control unit 105 to the ramp wave generating circuit 504 is at high level, the ramp wave generating circuit 504 starts the ramp wave output. When the second control signal CTL2 supplied from the control unit 105 to the ramp wave generating circuit 504 is at low level, the ramp wave generating circuit 504 stops the ramp wave output.

The reference voltage generating circuit 505 includes a first resistor 506 which is a fixed resistor and a second resistor 507 which is a variable resistor, and the reference voltage generating circuit generates a reference voltage corresponding to Vreq×B. One end of the first resistor 506 is connected to, for example, the power source (the battery or the like) of the electronic device 100. The other end of the first resistor 506 is connected to one end of the second resistor 507 and the third input terminal Vin-2 of the comparator 503 via a node 508. The other end of the second resistor 507 is connected to the ground line. In this manner, the reference voltage generating circuit 505 generates the reference voltage by dividing the voltage supplied from the power source of the electronic device 100 by the first resistor 506 and the second resistor 507. The reference voltage generated by the reference voltage generating circuit 505 is applied to the third input terminal Vin-2 of the comparator 503. The reference voltage generated by the reference voltage generating circuit 505 is changed when the control unit 105 controls the resistance value of the second resistor 507. In a case in which the voltage Vreq is, for example, 9 V and B is, for example, 1.05, the reference voltage is 945 V The control unit 105 can control the resistance value of the second resistor 507 to change the value of the reference voltage to a value depending on the voltage Vreq.

Note that the voltage of the VBUS terminal 101$b$ may be divided by a voltage dividing resistor before it is applied to the first input terminal Vin+ of the comparator 503. For example, it may be set so that a voltage which is a times (a<1) the voltage of the VBUS terminal 101$b$ will be applied to the first input terminal Vin+ of the comparator 503. In such a case, the ramp wave generating circuit 504 will output a ramp wave corresponding to a×30 mV/μs. Also, in such a case, the reference voltage generating circuit 505 will generate a reference voltage of a×Vreq×1.05 V.

In the above-described step S305, the comparator 503 compares the voltage (corresponding to the voltage of the VBUS terminal 101$b$) of the first input terminal Vin+ and the voltage (corresponding to, for example, 30 mV/μs) of the second input terminal Vin-1. If the voltage of the first input terminal Vin+ is lower than the voltage of the second input terminal Vin-1 (YES in step S305), the determination unit 104 will determine that the first condition expressed by inequality (1) is satisfied. If the first condition is satisfied, the control unit 105 proceeds to step S306. If the voltage of the first input terminal Vin+ is equal to or higher than the voltage of the second input terminal Vin-1 (NO in step S305), the determination unit 104 will determine that the first condition expressed by inequality (1) is not satisfied. If the first condition is not satisfied, the determination unit 104 supplies, to the control unit 105, a signal indicating that the voltage applied from the power supply apparatus 120 to the VBUS terminal 101$b$ is excessive, and the control unit 105 proceeds to step S309.

In the above-described step S306, the comparator 503 compares the voltage (corresponding to the voltage of the VBUS terminal 101$b$) of the first input terminal Vin+ and the voltage (corresponding to, for example, 9.45 V) of the third input terminal Vin-2. If the voltage of the first input terminal Vin+ is lower than the voltage of the third input terminal Vin-2 (YES in step S306), the determination unit 104 will determine that the second condition expressed by inequality (2) is satisfied. If the second condition is satisfied, the control unit 105 proceeds to step S307. If the voltage of the first input terminal Vin+ is equal to or higher than the voltage of the third input terminal Vin-2 (NO in step S306), the determination unit 104 will determine that the second condition is not satisfied. If the second condition is not satisfied, the determination unit 104 supplies, to the control unit 105, a signal indicating that the voltage applied from the power supply apparatus 120 to the VBUS terminal 101$b$ is excessive, and the control unit 105 proceeds to step S309.

In a case in which it is determined that one of the first condition and the second condition is not satisfied, a signal indicating that the voltage of the VBUS terminal 101$b$ is excessive is supplied from the comparator 503 to the control unit 105. In this case, the control unit 105 supplies, to the switch control unit 108, the control signal for selling the switch 106 to the OFF state. The switch control unit 108 sets the switch 106 to the OFF state based on the control signal supplied from the control unit 105.

In this manner, according to the first embodiment in case in which one of the first condition expressed by inequality (1) and the second condition expressed by inequality (2) is not satisfied, the control unit 105 will determine that the voltage applied from the power supply apparatus 120 to the VBUS terminal 101$b$ is excessive, and will set the switch 106 to the OFF state. Since the voltage of the CC terminal 101$a$ will change to a voltage (for example, 5 V) higher than the pull-down voltage when the switch 106 is set in the OFF state, the power supply apparatus 120 will determine that the power supply apparatus 120 has been disconnected from the electronic device 100. As a result, the power supply apparatus 120 stops the voltage application to the VBUS terminal 101$b$. Therefore, according to the first embodiment, the electronic device 100 can protect the internal circuitry (the load unit 109 or the like) connected to the VBUS terminal 101$b$ of the electronic device 100 from an excessive voltage.

Note that the embodiments of the disclosure are not limited to the first embodiment as described above. The embodiments of the disclosure include the first embodiment that has been changed or modified without departing from the scope of the disclosure.

Second Embodiment

Various kinds of functions, processes, or methods described in the first embodiment can be implemented by a personal computer, a microcomputer, a CPU (Central Processing Unit), a processor, or the like by using corresponding programs. In the second embodiment, a personal computer, a microcomputer, a CPU (Central Processing Unit), a processor, or the like will be referred to as a "computer X" hereinafter. Also, in the second embodiment, a program for controlling the computer X, that is, a program for implementing one of the various kinds of functions, processes, or methods described in the first embodiment will be referred to as a "program Y".

Each of the various kinds of functions, processes, or methods described in the first embodiment is implemented by the computer X executing the program Y In this case, the program Y is supplied to the computer X via a computer-readable storage medium. The computer-readable storage medium according to the second embodiment includes at least one of a hard disk device, a magnetic storage device, an optical storage device, a magneto-optical storage device, a memory card, a volatile memory, a nonvolatile memory, or the like. The computer-readable storage medium according to the second embodiment is a non-transitory storage medium.

Note that the embodiments of the disclosure are not limited to the second embodiment as described above. The embodiments of the disclosure include the second embodiment that has been changed or modified without departing from the scope of the disclosure.

While aspects of the disclosure are described with reference to exemplary embodiments, it is to be understood that the aspects of the disclosure are not limited to the exemplary embodiments. The scope of the following claims is to be accorded the broadest interpretation so as to encompass all modifications and equivalent structures.

This application claims priority from Japanese Patent Application No. 2017-254554, filed on Dec. 28, 2017, which is hereby incorporated by reference herein in its entirety.

What is claimed is:

1. An electronic device comprising:
   a first terminal that receives power supplied from a power supply apparatus;

a second terminal that is connected to a ground via a resistor and a switch;
a communication circuitry that performs a predetermined communication with the power supply apparatus via the second terminal, and requests the power supply apparatus to apply a voltage higher than 5 V to the first terminal;
a monitoring circuitry that monitors a voltage of the first terminal; and
a control circuitry that changes a state of the switch to a non-conductive state to lower the voltage applied by the power supply apparatus to the first terminal, in a case where a voltage variation per unit time of the first terminal is not less than a first predetermined value after the power supply apparatus applies the voltage higher than 5 V to the first terminal, or in a case where the voltage of the first terminal is not less than a second predetermined value after the power supply apparatus applies the voltage higher than 5 V to the first terminal.

2. The electronic device according to claim 1, wherein the first terminal conforms to USB (Universal Serial Bus) Type-C standard.

3. The electronic device according to claim 1, wherein the second predetermined value is a value depending on the voltage requested to the power supply apparatus to apply the first terminal.

4. The electronic device according to claim 1, wherein the second predetermined value is larger than a value of the voltage requested to the power supply apparatus to apply the first terminal.

5. The electronic device according to claim 1, wherein the second predetermined value is a value obtained based on the voltage requested to the power supply apparatus to apply the first terminal.

6. The electronic device according to claim 1, wherein the first predetermined value is 30 mV/μs.

7. A method comprising:
receiving power supplied from a power supply apparatus via a first terminal;
performing a predetermined communication with the power supply apparatus via a second terminal connected to a ground via a resistor and a switch;
requesting the power supply apparatus to apply a voltage higher than 5 V to the first terminal;
monitoring a voltage of the first terminal; and
changing a state of the switch to a non-conductive state to lower the voltage applied by the power supply apparatus to the first terminal, in a case where a voltage variation per unit time of the first terminal is not less than a first predetermined value after the power supply apparatus applies the voltage higher than 5 V to the first terminal, or in a case where the voltage of the first terminal is not less than a second predetermined value after the power supply apparatus applies the voltage higher than 5 V to the first terminal.

8. A non-transitory storage medium that stores a program causing a computer to execute a method, the method comprising:
receiving power supplied from a power supply apparatus via a first terminal;
performing a predetermined communication with the power supply apparatus via a second terminal connected to a ground via a resistor and a switch;
requesting the power supply apparatus to apply a voltage higher than 5 V to the first terminal;
monitoring a voltage of the first terminal; and
changing a state of the switch to a non-conductive state to lower the voltage applied by the power supply apparatus to the first terminal, in a case where a voltage variation per unit time of the first terminal is not less than a first predetermined value after the power supply apparatus applies the voltage higher than 5 V to the first terminal, or in a case where the voltage of the first terminal is not less than a second predetermined value after the power supply apparatus applies the voltage higher than 5 V to the first terminal.

9. The electronic device according to claim 1, wherein the power supply apparatus stops supplying power from the power supply apparatus to the first terminal in a case where the state of the switch is changed to the non-conductive state.

10. The electronic device according to claim 1, wherein the predetermined communication performed with the power supply apparatus conforms to USB (Universal Serial Bus) Power Delivery standard.

11. The electronic device according to claim 1, wherein the electronic device is capable of acting as an image capture apparatus.

12. The electronic device according to claim 1, wherein the electronic device is capable of acting as a mobile device.

13. The method according to claim 7, wherein the first terminal conforms to USB (Universal Serial Bus) Type-C standard.

14. The method according to claim 7, wherein the second predetermined value is a value depending on the voltage requested to the power supply apparatus to apply the first terminal.

15. The method according to claim 7, wherein the second predetermined value is larger than a value of the voltage requested to the power supply apparatus to apply the first terminal.

16. The method according to claim 7, wherein the second predetermined value is a value obtained based on the voltage requested to the power supply apparatus to apply the first terminal.

17. The method according to claim 7, wherein the first predetermined value is 30 mV/μs.

18. The method according to claim 7, wherein the power supply apparatus stops supplying power from the power supply apparatus to the first terminal in a case where the state of the switch is changed to the non-conductive state.

19. The method according to claim 7, wherein the predetermined communication performed with the power supply apparatus conforms to USB (Universal Serial Bus) Power Delivery standard.

* * * * *